United States Patent [19]

Chellman

[11] Patent Number: 5,414,350
[45] Date of Patent: May 9, 1995

[54] ROTATING MAGNET MEASURING INSTRUMENT AND METHOD FOR EQUALIZING COIL WINDINGS

[75] Inventor: James H. Chellman, Clinton, Mich.

[73] Assignee: Ford Motor Company, Dearborn, Mich.

[21] Appl. No.: 2,003

[22] Filed: Jan. 8, 1993

[51] Int. Cl.⁶ .......................... H01F 27/28; G01R 1/20
[52] U.S. Cl. ..................................... 324/143; 324/146; 336/188
[58] Field of Search ........... 324/143, 144, 146, 207.18, 324/131, 132; 336/171, 181, 188, 189, 220–222, 234; 335/299, 282, 222; 310/208

[56] References Cited

U.S. PATENT DOCUMENTS

| | | |
|---|---|---|
| 3,208,059 | 9/1965 | Ziegler . |
| 3,327,208 | 6/1967 | Allen . |
| 3,660,814 | 5/1972 | Fales . |
| 3,665,383 | 5/1972 | Fales . |
| 3,747,036 | 7/1973 | Erdmann ..................... 336/181 |
| 4,633,174 | 12/1986 | Lingdig et al. ...................... 324/143 |
| 4,827,210 | 5/1989 | Lindig et al. ........................ 324/143 |
| 5,047,715 | 9/1991 | Morgenstern ................... 324/207.26 |
| 5,061,891 | 10/1991 | Totsuka et al. ...................... 336/188 |
| 5,243,277 | 9/1993 | Totsuka et al. ...................... 324/146 |

FOREIGN PATENT DOCUMENTS 62-208611  7/1986  Japan ................................... 336/181

*Primary Examiner*—Sandra L. O'Shea
*Assistant Examiner*—Jay M. Patidar
*Attorney, Agent, or Firm*—Roger L. May; Richard D. Dixon

[57] ABSTRACT

A rotating magnetic measuring instrument including a form for receiving thereon first and second coil windings, with the second coil being wound within the first coil. The second coil includes a section thereof wound in a reverse direction for reducing the effective magnetic moment of the second coil so as to be substantially equal in magnitude to the effective magnetic moment of the first coil. The rotating magnetic measuring instrument also includes a magnetic indicator carried by the coil form that is rotated by to magnetic moments produced by the flow of current through the first and the second coils.

13 Claims, 1 Drawing Sheet

ROTATING MAGNET MEASURING INSTRUMENT AND METHOD FOR EQUALIZING COIL WINDINGS

BACKGROUND OF THE INVENTION

1. Field of the Invention

The present invention relates to instrumentation gauges of the type used in automotive vehicles, and more specifically to a method for equalizing the magnetic moments produced by the inner and outer coil windings in a rotating magnet measuring instrument.

2. Description of the Prior Art

An electrical gauge of the type utilizing air core coils to obtain pointer movement over a range of 90° and more is favored for inexpensive, highly accurate instrumentation gauges in automotive vehicles.

An outer coil is wound over an inner coil, and the plane of the windings are offset from each other by 90°. The magnetic field produced by one coil operates in conjunction with the magnetic field produced by the other coil. An armature in the form of a permanent magnet is rotatably supported along the center line of the intersection of the magnetic fields from the two coils. As the magnetic fields from the coils change in response to currents through the coils, the permanent magnetic armature is rotated, which in turn causes an angular displacement of a visual pointer attached to the shaft.

Since one coil is wound over the other coil, the outer coil has an effective diameter larger than the inner coil. This difference in diameter causes a difference in the magnetic moment that acts on the permanent magnet armature. It is important to control the magnetic strength emitting from each of the coils, especially with respect to each other, in order to accurately control the position of the gauge pointer. One method of equalizing the magnetic strengths of the two coils would be to wind an additional number of turns in the outer coil to increase the magnetic flux for a given current running through the coil. However, the additional wire added to the coil would increase the resistance of the coil, and therefore would reduce the current flowing through the coil for a given applied voltage.

When integrated circuits are used to drive the inner and outer coils, it is highly desirable to use a standard integrated circuit that employs the same output drivers, gain coefficients, impedances, etc. for the two drive channels. Therefore, it is important for both the inner and outer coils to have the same dc resistance so that the same current will flow through each coil when a given voltage is applied to the terminals of the coils. Because the inner coil is magnetically more efficient in turning the armature and the pointer, it is necessary to provide some other method of equalization if the same length of wire is to be used for both the inner and outer coils.

Allen in U.S. Pat. No. 3,327,208 illustrates a common prior art solution to this problem by employing an adjustable resistor in series with the inner coil in order to reduce the effective current through the more magnetically efficient coil. However, if the driving circuits are to be used for a variety of different coils, it would be necessary to individually adjust and calibrate the variable resistance based upon each coil design, and even for variations in the same coil as manufactured at different locations or on different equipment.

The present invention provides another solution for this problem by equalizing the dc resistance of the two coils through the use of the same conductor length for each coil, while winding a section of the inner coil in reverse direction to reduce the net magnetic efficiency of the coil while maintaining its equivalent dc resistance.

SUMMARY OF THE INVENTION

Accordingly, it is a principle object of the present invention to provide a method and apparatus for equalizing the magnetic efficiency of coils used in a rotating magnetic measuring instrument, while maintaining the same dc resistance for the coils.

These and other objects are achieved by the present invention which utilizes a winding form for receiving coil windings thereon, and a magnetic armature and attached indicator carried by the winding form and rotatable therewithin responsive to magnetic moments produced by the coils. An outer coil is wound around an inner coil of substantially equivalent length. The inner coil includes a section thereof that is wound in the reverse direction for reducing the effective magnetic moment of the inner coil so as to be substantially equal in magnitude to the effective magnetic moment of the outer coil.

BRIEF DESCRIPTION OF THE DRAWINGS

The novel features of the invention are set forth with particularity in the appended claims. The invention itself, however, both as to its organization and method of operation, together with further objects and advantages thereof, may be understood by reference to the following descriptions taken in conjunction with the accompanying drawings, in which:

DETAILED DESCRIPTION OF THE PREFERRED EMBODIMENT

Figure 1:
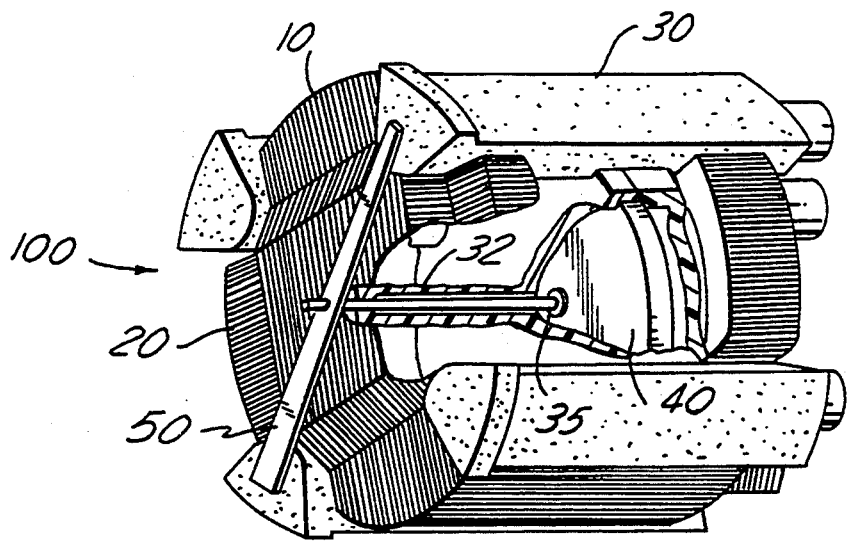
FIG. 1 illustrates a perspective, partially cross-sectioned view of a rotating magnet measuring instrument in accordance with the present invention.

A first preferred embodiment of a rotating magnet measuring instrument in accordance with the present invention is shown generally as 100 in FIG. 1. While the first preferred embodiment is illustrated as being implemented in conjunction with an air core gauge with 2 independent coils offset by 90 degrees, it should be apparent that the method and solutions proposed are equally adaptable for use in measuring instrumentation of several different varieties, including speedometer and tachometer as illustrated herein or fuel, temperature and oil indicators which have wound coils that are connected in series and which are controlled by a device using variable resistance/voltage/current for causing a change in the pointer position of the gauge.

With reference to the air core gauge 100 illustrated in FIG. 1, a first or outer coil winding 10 is composed of a single length of electrically conductive wire, typically 28 AWG to 40 AWG copper wire, with a thin insulating coating on the outside surface thereof. The first coil 10 comprises approximately 1000–2000 coils or turns of wire coiled over a coil form 30. A second or inner coil winding 20 comprises the same length of the same type wire coiled around different guides in a coil form 30 such that the magnetic axis of the second coil 20 is displaced approximately 90° from the magnetic axis of the first or outer coil 10. The outer coil 10 and the inner coil 20 intersect along a common axis which is coincident with a rotating shaft 35 that is carried by apertures 32 communicating through the coil form 30.

The rotating shaft 35 also carries a permanent magnet armature 40 that is permanently coupled to the rotating shaft 35 so as to be freely rotatable around the axis defined by the shaft 35. A pointer 50 is fixed to a distended end of the rotating shaft 35 for providing a visual representation of the angular displacement of the shaft 35 and the permanent magnet armature 40 that results from the flow of current through the coil windings. The relationship between the currents driven through the two coils 10 and 20 will define the resulting magnetic flux from the coils, and will thereby define the deflection of the armature 40 and the pointer 50 produced by the magnetic moment acting on the armature 40.

While the first preferred embodiment is shown with a first coil 10 and a second coil 20 displaced by 90° from each other, it will be apparent that three or more coils can be utilized with angular displacements dependent upon the required arc of rotation for the pointer 50. Regardless of the number of coils utilized, the permanent magnet armature 40 will attempt to align its poles with the net magnetic field produced by the coils.

Figure 2:
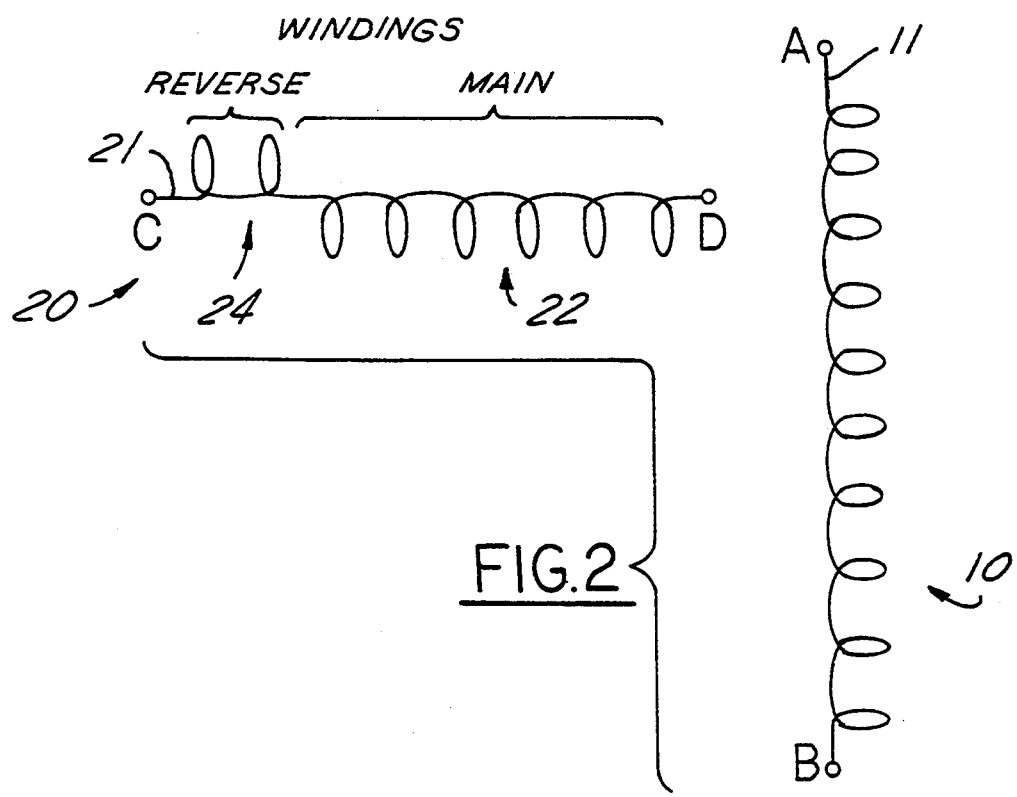
FIG. 2 is a schematic representation of the windings used in the inner and outer coils in accordance with the present invention.

With reference to FIG. 2, the first or outer coil 10 is shown as comprising a length of conductive wire 11 having ends A and B. The wire 11 is coiled numerous times about the coil form 30, which is depicted as loops in FIG. 2.

In a similar manner, the second or inner coil 20 is illustrated as a length of wire 21 having a series of first coils 22 comprising the main section of the coil windings and a second section 24 of coil windings that are wound in the reverse direction as compared with the main windings 22. This reverse winding is best accomplished by the use of an automated coil winding machine that reverses direction at the point where the reverse winding coil elements 24 are to be located.

In the first preferred embodiment of the present invention, the length of wire 11 used in the outer coil 10 is generally the same as the length of wire 21 used in the inner coil 20. As used herein, the term "generally the same" will indicate that the lengths are the same within typical manufacturing tolerances that are acceptable within the industry. Since the same wire is used for both the outer coil 10 and the inner coil 20, and since both coils have the same length, the dc resistance between terminals A and B, and between terminals C and D should be equivalent. If a known voltage is supplied across both terminals A-B and C-D, the same current would flow through each of the coils. If the outer coil 10 had the same effective diameter as the inner coil 20, and if both coils had the same number of windings, then the magnetic moment produced on the armature 40 by each coil would be the same. However, as illustrated in FIG. 1, since the effective diameter of the outer coil winding 10 is slightly larger than the effective diameter of the inner coil winding 20, the magnetic moment produced by the inner coil is slightly greater than the magnetic moment produced by the outer coil, assuming that both coils are driven with identical amplifiers that provide identical currents therethrough.

The difference between the magnetic moments produced by the outer coil 10 and the inner coil 20 can be subtracted from the inner coil 20 by reverse winding several of the coil windings 24. However, as each turn in the inner coil 20 is reversed, not only is the resulting magnetic moment reduced by the amount that the single turn contributed, but the additional flux added in the reverse direction must be subtracted from the flux produced by the remainder of the main windings 22. Therefore, the difference in the magnetic moments between the outer coil 10 and the inner coil 20 must be divided by 2 in order to determine the number of turns or coils to be reversed in the winding process.

In the first preferred embodiment illustrated in FIGS. 1 and 2, the outer coil 10 comprises a length of approximately 88 meters of 38 AWG wire and includes approximately 1550 turns of approximately 1.9 centimeters in diameter. The inner coil 20 comprises a length of approximately 88 meters of 38 AWG wire and includes approximately 1560 turns comprising the main windings 22 and approximately 90 turns comprising the reverse windings 24. As will be appreciated by one skilled in this technology, the lengths of wire, the wire size and number of turns can vary depending on the dimensions and shape of the coil form selected and depending on the final resistance of the coils that are required in each specific design.

In this manner the flux densities and magnetic moments produced by the inner coil 20, including the reverse windings, and the outer coil 10 will be equalized, thereby providing an improved linearity for the air core gauge.

I claim:

1. A crossed coil rotating magnetic measuring instrument comprising:
   form means for receiving crossed coil windings thereon,
   a first coil carried by said form means,
   a second coil carried by said form means substantially within and crossed with said first coil, said second coil having a section thereof wound in the reverse direction from the remainder of said second coil for reducing the effective magnetic moment of said second coil so as to be substantially equal in magnitude to the effective magnetic moment of said first coil with equal currents flowing therethrough,
   magnetic indicator means carried by said form means and rotated by magnetic moments produced by driving current through said first and second coils.

2. The rotating magnetic measuring instrument described in claim 1 wherein the length and resistivity of a conductor wound as said first coil are substantially equal to the length and resistivity of a conductor wound as said second coil.

3. The rotating magnetic measuring instrument described in claim 1 wherein the dc resistance of said first coil is substantially equal to the dc resistance of said second coil.

4. The rotating magnetic measuring instrument described in claim 2 wherein the effective magnetic moment of said first coil is angularly displaced by approximately 90° from the effective magnetic moment of said second coil.

5. The rotating magnetic measuring instrument described in claim 4 wherein a winding axis of said first coil is offset by approximately 90° from a winding axis of said second coil.

6. The rotating magnetic measuring instrument described in claim 2 wherein the length of wire comprising said reverse wound section of said second coil generates a magnet moment approximately equal to one-half of the difference between the magnetic moments of said first coil and said second coil if the full length of the conductor of said second coil were wound in a single direction without said reverse wound section therein.

7. The rotating magnetic measuring instrument described in claim 2 wherein the magnitude of the net magnetic moment produced by said reverse wound section of said second magnetic coil is approximately equal to the reduction in the magnetic moment caused by said first coil being spaced concentrically outside of said second coil.

8. A rotating magnetic measuring instrument comprising:
   form means for receiving crossed coil windings thereon,
   a conductor wound into a first coil carried by said form means,
   another conductor wound into a second coil, carried by said form means, being generally equal in length and dc resistance to the conductor of said first coil, with said first coil being wound within but offset approximately 90° from the windings of said first coil, and with one end section of said another conductor in said second coil being wound in the reverse direction for equalizing the magnitude of the magnetic moments produced by equal current flowing through said first and second coils, and
   magnetic indicator means carried by said form means and rotatable about an axis generally parallel to the effective plane of said first and second coils responsive to magnetic moments produced by currents flowing therethrough.

9. The rotating magnetic measuring instrument described in claim 8 wherein in the length of said another conductor comprising said reverse wound section of said second coil generates a magnetic moment approximately equal to one-half of the difference in the magnetic moments of said first coil and said second coil if the full length of the conductor of said second coil were wound in a single direction without said reverse wound section therein.

10. The rotating magnetic measuring instrument described in claim 8 wherein the magnitude of the net magnetic moment produced by said reverse wound section of said second magnetic coil is approximately equal to the reduction in the magnetic moment caused by said first coil being spaced concentrically outside of said second coil.

11. A method for equalizing the magnetic moments produced by currents flowing through inner and outer cross wound coils for deflecting a magnetic indicator carried within the coils, comprising the steps of:
   winding the inner coil to yield a first resistance, including one section wound in one direction and another section wound in the reverse direction about a common coil axis, with the magnetic moment of said another section at least partially cancelling the magnetic moment of said one section for yielding a net first magnetic moment for the inner coil,
   cross winding the outer coil over the inner coil to yield a resistance equal to said first resistance and a magnetic moment equal to said first magnetic moment,
   whereby the reverse wound section of the inner coil equalizes the magnetic moments of the inner and outer coils.

12. The method as described in claim 11 further including the step of cross winding the outer coil with a winding plane approximately 90° offset from the winding plane of the inner coil.

13. The method as described in claim 11 further including the step of cross winding the inner coil and the outer coil with conductors of the same size and resistivity.

* * * * *